(12) United States Patent
Moriwaki et al.

(10) Patent No.: US 7,012,469 B2
(45) Date of Patent: Mar. 14, 2006

(54) INTEGRATED CIRCUIT DEVICE HAVING HIGH EFFICIENCY AT THE TIME OF LOW POWER OUTPUT

(75) Inventors: Takao Moriwaki, Tokyo (JP); Hiroyuki Otsuka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 32 days.

(21) Appl. No.: 10/650,661

(22) Filed: Aug. 29, 2003

(65) Prior Publication Data

US 2005/0174177 A1    Aug. 11, 2005

(30) Foreign Application Priority Data

Mar. 10, 2003    (JP) .............................. 2003-063070

(51) Int. Cl.
*H03G 3/30*    (2006.01)
(52) U.S. Cl. ...................................... 330/285; 330/296
(58) Field of Classification Search ................ 330/285, 330/296
See application file for complete search history.

(56) References Cited

U.S. PATENT DOCUMENTS

| 3,896,394 | A | * | 7/1975 | Baro ........................... 330/289 |
| 5,229,731 | A | * | 7/1993 | Yamamoto ................... 330/296 |
| 5,654,672 | A | * | 8/1997 | Bailey et al. ................ 330/289 |
| 6,046,642 | A | * | 4/2000 | Brayton et al. .............. 330/296 |
| 6,448,859 | B1 | | 9/2002 | Morizuka |
| 6,492,874 | B1 | * | 12/2002 | Shih ............................ 330/289 |
| 6,566,954 | B1 | * | 5/2003 | Miyazawa ................... 330/285 |
| 6,731,171 | B1 | * | 5/2004 | Yamashita ................... 330/285 |
| 6,750,718 | B1 | * | 6/2004 | Moriwaki et al. ........... 330/285 |

FOREIGN PATENT DOCUMENTS

| JP | 6-13816 | 1/1994 |
| JP | 2001-274636 | 10/2001 |

* cited by examiner

*Primary Examiner*—Khanh V. Nguyen
(74) *Attorney, Agent, or Firm*—Leydig, Voit & Mayer, Ltd.

(57) ABSTRACT

An integrated circuit device includes a semiconductor amplification element and a bias circuit for applying a bias voltage to the semiconductor amplification element. A power source of the bias circuit is connected to a power source of the semiconductor amplification element via a semiconductor element such that idle current of the semiconductor amplification element is changed in response to a change of a supply voltage of the semiconductor amplification element.

9 Claims, 2 Drawing Sheets

INTEGRATED CIRCUIT DEVICE HAVING HIGH EFFICIENCY AT THE TIME OF LOW POWER OUTPUT

BACKGROUND OF THE INVENTION

1. Field of the Invention

The present invention generally relates to integrated circuit devices and, more particularly, to an integrated circuit device acting as a transmission power amplifier circuit for a code division multiple access (CDMA) modulation portable terminal, in which a setting bias of an amplifier is switched at of low power output and high power output and a bipolar transistor is employed for raising efficiency at low power output.

2. Description of the Prior Art

In a transmission power amplifier circuit for a CDMA modulation portable terminal, since power control is performed during communication, high priority is given to not only additional efficiency at the time of high power output but efficiency at the time of low power output. Thus, the amplifier is operated by switching a setting bias of an amplifier at the time of low power output and high power output. Therefore, a conventional power amplifier circuit disclosed in, Japanese Patent Laid-Open Publication No. 6-13816 (1994) includes a high-frequency transistor for amplifying a signal and a bias circuit for supplying a base bias to the high-frequency transistor such that a bias switch for changing a setting bias of the high-frequency transistor is provided in the bias circuit. Meanwhile, another known power amplifier circuit disclosed in, Japanese Patent Laid-Open Publication No. 2001-274636 (2001) includes a bias circuit in which a bias generating circuit and a reference voltage generating circuit acting as a temperature compensation circuit for temperature compensation of the bias generating circuit are provided.

In a prior art power amplifier circuit in which the configurations of the above conventional power amplifier circuit and the above known power amplifier circuit are combined with each other, the bias changeover switch is turned off at the time of high power output of the high-frequency transistor such that a voltage from the bias circuit is supplied to the high-frequency transistor as it is. The base bias of the high-frequency transistor at this time is set such that the high-frequency transistor fully satisfies distortion characteristics at the time of high power output.

On the other hand, at the time of low power output of the high-frequency transistor, the bias changeover switch is turned on, so that electric current flows through the bias changeover switch such that the base bias of the high-frequency transistor is lowered. At the time of low power output of the high-frequency transistor, since the high-frequency transistor lies in a linear operation area even if the base bias is lowered, the high-frequency transistor can operate under conditions in which the high-frequency transistor is capable of fully satisfying the distortion characteristics.

By this base bias changeover function of the bias changeover switch, the high-frequency transistor can raise efficiency at the time of low power output having the linear operation area. Meanwhile, in order to greatly raise efficiency at the time of low power output of the high-frequency transistor, it is effective to change over a collector supply voltage of the high-frequency transistor such that at the time of low power output, the collector supply voltage is lowered to a level at which the distortion characteristics of the high-frequency transistor are satisfied.

In the above described prior art power amplifier circuit including the bias changeover switch for changing over the base bias of the high-frequency transistor, the bias changeover switch changes over the base bias set by the bias circuit so as to reduce idle current of the high-frequency transistor such that efficiency at the time of low power output is raised. The efficiency at the time of low power output exhibits an increase of 1 to 2%.

Meanwhile, in case the collector supply voltage of the high-frequency transistor at the time of low power output is lowered, for example, from 3.5 V to 1.2 V, an increase of the efficiency amounts to 15% approximately.

If the function of changing over the base bias of the high-frequency transistor and the function of changing over the collector supply voltage of the high-frequency transistor are performed in combination, the efficiency is raised largely. However, in order to impart these changeover functions to the prior art power amplifier circuit, such problems arise that the number of components of the portable terminal increases and the portable terminal becomes larger in size resultantly.

SUMMARY OF THE INVENTION

Accordingly, an essential object of the present invention is to provide, with a view to eliminating the above mentioned drawbacks of prior art, a high-frequency integrated circuit device in which connection of a power source of a high-frequency transistor to that of a bias circuit serves to, at the time of low power output of the high-frequency transistor, not only lower a collector supply voltage of the high-frequency transistor but reduce idle current of the high-frequency transistor so as to raise efficiency at the time of low power output of the high-frequency transistor.

In order to accomplish this object of the present invention, a high-frequency integrated circuit device according to the present invention includes a semiconductor amplification element. A bias circuit applies a bias voltage to the semiconductor amplification element. A power source of the bias circuit is connected to a power source of the semiconductor amplification element via a semiconductor element such that idle current of the semiconductor amplification element can be changed in response to change of a supply voltage of the semiconductor amplification element.

BRIEF DESCRIPTION OF THE DRAWINGS

This object and features of the present invention will become apparent from the following description taken in conjunction with the preferred embodiments thereof with reference to the accompanying drawings in which.

DETAILED DESCRIPTION OF THE INVENTION

Hereinafter, embodiments of the present invention are described with reference to the drawings.

(First Embodiment)

Figure 1:
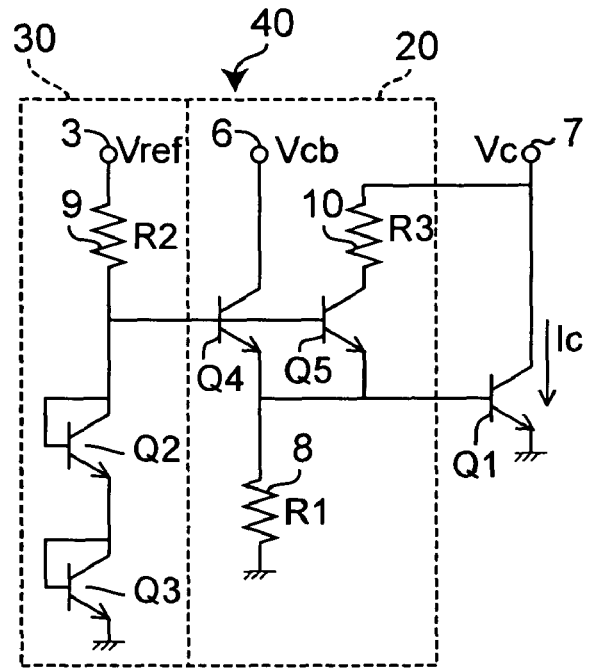
FIG. 1 is a circuit diagram showing a configuration of a transmission power amplifier circuit for a CDMA modulation type portable terminal as a high-frequency integrated circuit device according to a first embodiment of the present invention.

FIG. 1 shows a configuration of a transmission power amplifier circuit for a CDMA modulation type portable terminal as a high-frequency integrated circuit device according to a first embodiment of the present invention. This power amplifier circuit employs bipolar transistors as transistors and includes a high-frequency transistor Q1 for amplifying a high-frequency signal and a bias circuit 40 for supplying a base bias to the high-frequency transistor Q1. The bias circuit 40 is constituted by a bias generating circuit 20 for generating the base bias and a temperature compensation circuit 30 for performing temperature compensation of the bias generating circuit 20. A collector supply voltage Vc is supplied from a collector power source 7 to the high-frequency transistor Q1 such that a collector current Ic flows through the high-frequency transistor Q1.

The bias generating circuit 20 includes a power source 6 for receiving a bias voltage Vcb and transistors Q4 and Q5, which transistors form an emitter follower circuit. The base bias of the high-frequency transistor Q1 is outputted from the emitter follower circuit. A collector of the transistor Q4 is connected to the power source 6, while emitters of the transistors Q4 and Q5 are grounded via a resistor 8 having a resistance R1. A collector of the transistor Q5 is connected to the collector power source 7 of the high-frequency transistor Q1 through a resistor 10 having a resistance R3.

The temperature compensation circuit 30 includes a terminal 3 for receiving a reference voltage Vref, a resistor 9 having a resistance R2 and transistors Q2 and Q3, which transistors are each diode-connected. A base of the transistors Q4 and Q5 of the bias generating circuit 20 is connected to a junction of the transistor Q2 and the resistor 9. In the temperature compensation circuit 30, threshold value of the transistors Q2 and Q3 changes according to temperature so as to compensate for change of threshold value of the transistors Q4 and Q5 of the bias generating circuit 20 caused by temperature such that temperature compensation of idle current of the high-frequency transistor Q1 is performed.

Hereinafter, operation of the power amplifier circuit of the above described configuration is described. In FIG. 1, when the collector supply voltage Vc of the high-frequency transistor Q1 is changed over at the time of low power output and high power output of the high-frequency transistor Q1 by connecting the collector of the transistor Q5 to the collector power source 7 of the high-frequency transistor Q1 through the resistor 10 having the resistance R3, the high-frequency transistor Q1 is operated through changeover of the base bias and the collector bias. In case the high-frequency transistor Q1 is an AlGaAs heterojunction bipolar transistor (HBT), the bias voltage Vcb supplied to the power source 6 of the bias generating circuit 20 and the reference voltage Vref supplied to the terminal 3 of the temperature compensation circuit 30 are set to about 3 V.

At the time of high power output of the high-frequency transistor Q1, the collector supply voltage Vc of the high-frequency transistor Q1 is set high to, for example, 3.5 V. The resistance R3 of the resistor 10 is set such that collector current of the transistor Q5 flows sufficiently at this time. The base bias of the high-frequency transistor Q1 is outputted from the emitter follower circuit formed by the transistors Q4 and Q5.

At the time of low power output of the high-frequency transistor Q1, the collector supply voltage Vc of the high-frequency transistor Q1 is set low to, for example, 1.2 V. At this time, since there is no potential difference between an emitter and a collector of the transistor Q5, collector current of the transistor Q5 does not flow. Therefore, since the base bias of the high-frequency transistor Q1 is outputted from the emitter follower circuit formed by only the transistor Q4, the base bias of the high-frequency transistor Q1 is set low and thus, idle current of the high-frequency transistor Q1 is set to be smaller than that at the time of high power output.

In the high-frequency transistor Q1, quantity of change of the idle current relative to that of the collector supply voltage Vc is determined by a magnitude of the resistance R3 of the resistor 10 and a ratio of a size of the transistor Q4 to that of the transistor Q5.

In this embodiment, the collector power source 7 of the high-frequency transistor Q1 is connected to the collector of the transistor Q5 through the resistor 10 having the resistance R3. Therefore, at the time of low power output of the high-frequency transistor Q1, not only the collector supply voltage Vc of the high-frequency transistor Q1 is lowered but the idle current of the high-frequency transistor Q1 is reduced. As a result, it is possible to raise efficiency at the time of low power output of the high-frequency transistor Q1.

(Second Embodiment)

Figure 2:
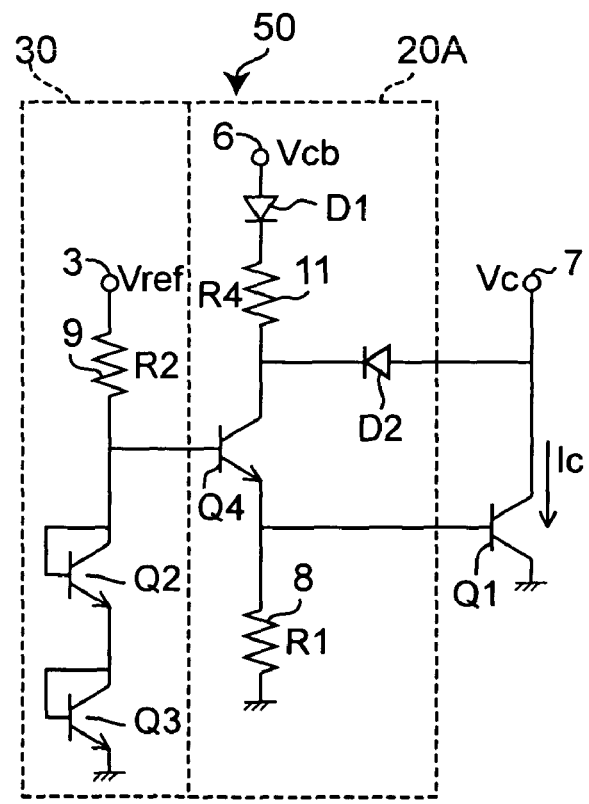
FIG. 2 is a circuit diagram showing a configuration of a transmission power amplifier circuit for a CDMA modulation type portable terminal as a high-frequency integrated circuit device according to a second embodiment of the present invention.

FIG. 2 shows a configuration of a transmission power amplifier circuit for a CDMA modulation type portable terminal as a high-frequency integrated circuit device according to a second embodiment of the present invention. This power amplifier circuit includes the high-frequency transistor Q1 and a bias circuit 50. The bias circuit 50 is constituted by a bias generating circuit 20A and the temperature compensation circuit 30. The base bias of the high-frequency transistor Q1 is outputted from an emitter follower circuit formed by only the transistor Q4. A collector of the transistor Q4 has two branch lines. One of the branch lines is connected to the power source 6 of the bias generating circuit 20A by way of a resistor 11 having a resistance R4 and a diode D1, while the other of the branch lines is connected to the collector power source 7 of the high-frequency transistor Q1 via a diode D2. Since other configurations of this power amplifier circuit are similar to those of the power amplifier circuit of FIG. 1, the description is abbreviated for the sake of brevity.

In the power amplifier circuit of FIG. 2, by changing over the collector supply voltage Vc of the high-frequency transistor Q1 at the time of low power output and high power output of the high-frequency transistor Q1 in the same manner as the first embodiment, the high-frequency transistor Q1 is operated through changeover of the base bias and the collector bias. In the same manner as the first embodiment, the bias voltage Vcb and the reference voltage Vref are set to about 3 V.

At the time of high power output of the high-frequency transistor Q1, the collector supply voltage Vc of the high-frequency transistor Q1 is set high to, for example, 3.5 V. At this time, the collector bias of the high-frequency transistor Q1 is supplied through the diode D2. In case the diode D2 is formed by an AlGaAs HBT, the diode D2 has a threshold voltage of about 1.2 V. Therefore, since a collector voltage of about 2.3 V is supplied to the transistor Q4, the transistor Q4 is operated in a saturation area such that a sufficiently high base bias is supplied to the high-frequency transistor Q1.

At the time of low power output of the high-frequency transistor Q1, the collector supply voltage Vc of the high-frequency transistor Q1 is set low to, for example, 1.2 V. At this time, since the diode D2 is turned off, the collector bias of the transistor Q4 is supplied from the power source 6 via the diode D1 and the resistor 11. In case the transistor Q4 is an AlGaAs HBT so as to be operated in a linear region at this time, the resistance R4 of the resistor 11 is determined such that a voltage between a collector and an emitter of the transistor Q4 assumes about 0.3 V. As a result, the base bias of the high-frequency transistor Q1 is set to be lower than that at the time of high power output and the idle current of the high-frequency transistor Q1 is reduced.

The configuration of the second embodiment employing the diodes D1 and D2 and the resistor 11 can be applied to the configuration of the first embodiment employing the emitter follower circuit formed by the transistors Q4 and Q5.

In this embodiment, the collector power source 7 of the high-frequency transistor Q1 is connected to the power source 6 of the bias circuit 50. Therefore, at the time of low power output of the high-frequency transistor Q1, not only the collector supply voltage Vc of the high-frequency transistor Q1 is lowered but the idle current of the high-frequency transistor Q1 is reduced. As a result, it is possible to raise efficiency at the time of low power output of the high-frequency transistor Q1.

(Third Embodiment)

Figure 3:
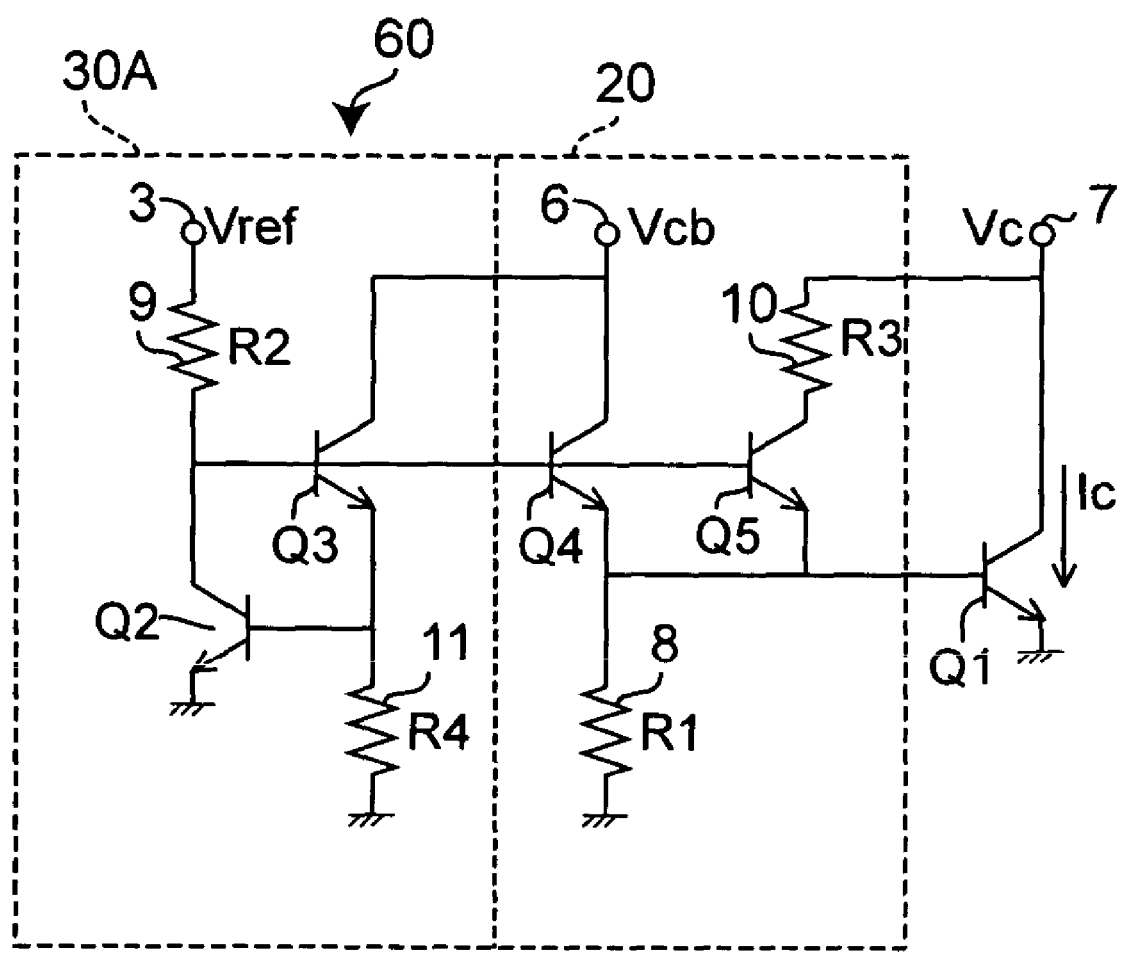
FIG. 3 is a circuit diagram showing a configuration of a transmission power amplifier circuit for a CDMA modulation type portable terminal as a high-frequency integrated circuit device according to a third embodiment of the present invention.

FIG. 3 shows a configuration of a transmission power amplifier circuit for a CDMA modulation type portable terminal as a high-frequency integrated circuit device according to a third embodiment of the present invention. This power amplifier circuit includes the high-frequency transistor Q1 and a bias circuit 60. The bias circuit 60 is constituted by the bias generating circuit 20 and a temperature compensation circuit 30A. In the temperature compensation circuit 30 of the first embodiment, each of the transistors Q2 and Q3 is diode-connected. On the other hand, in the temperature compensation circuit 30A, the transistors Q2 and Q3 form a current mirror circuit and an emitter of the transistor Q3 is grounded via the resistor 11. Since other configurations of this power amplifier circuit are similar to those of the power amplifier circuit of FIG. 1, the description is abbreviated for the sake of brevity.

In comparison with the temperature compensation circuit 30 of FIG. 1 in which each of the transistors Q2 and Q3 is diode-connected, temperature compensation of the bias generating circuit 20 is performed to a higher level by the temperature compensation circuit 30A in which the transistors Q2 and Q3 form the current mirror circuit, so that temperature characteristics of the power amplifier circuit are further improved.

The configuration of the third embodiment in which the current mirror circuit is used for the temperature compensation circuit 30A can be applied to the power amplifier circuit of the second embodiment.

In this embodiment, the collector power source 7 of the high-frequency transistor Q1 is connected to the collector of the transistor Q5 through the resistor 10 having the resistance R3. Therefore, at the time of low power output of the high-frequency transistor Q1, not only the collector supply voltage Vc of the high-frequency transistor Q1 is lowered but the idle current of the high-frequency transistor Q1 is reduced. As a result, it is possible to raise efficiency at the time of low power output of the high-frequency transistor Q1.

Furthermore, in this embodiment, since the transistors Q2 and Q3 of the temperature compensation circuit 30A form the current mirror circuit capable of performing temperature compensation of the bias generating circuit 20 to a higher level, temperature characteristics of the power amplifier circuit are further improved.

In the first to third embodiments referred to above, the high-frequency transistor Q1 is used as a single-stage amplifier but may also be used as a multistage amplifier.

Meanwhile, in the first to third embodiments, even if the bias circuit is formed on a single chip or on a plurality of chips, the similar effects can be gained.

Furthermore, in the bias generating circuit of the first to third embodiments, the emitter follower circuit formed by either only the transistor Q4 or the transistors Q4 and Q5 is employed but the similar effects can be achieved even if the resistor 8 is replaced by a diode.

Moreover, in the temperature compensation circuit of the first and third embodiments, in case on-off control of base current of the high-frequency transistor Q1 is not performed by the reference voltage Vref, the transistor Q5 is not required to be provided for connecting the collector power source 7 to the base of the high-frequency transistor Q1 but only the resistor 10 may be provided therefor.

As is clear from the foregoing description, the high-frequency integrated circuit device of the present invention includes the semiconductor amplification element and the bias circuit for applying the bias voltage to the semiconductor amplification element. Furthermore, the power source of the bias circuit is connected to the power source of the semiconductor amplification element via the semiconductor element such that idle current of the semiconductor amplification element can be changed in response to change of the supply voltage of the semiconductor amplification element.

Therefore, at the time of low power output of the semiconductor amplification element, not only the supply voltage of the semiconductor amplification element is lowered but the idle current of the semiconductor amplification element is reduced. As a result, it is possible to raise efficiency at the time of low power output of the semiconductor amplification element.

What is claimed is:

1. An integrated circuit device comprising:
    an amplification transistor supplied with a voltage from a first power source;
    a bias circuit including a bias generating circuit for generating a base bias voltage applied to the amplification transistor, wherein
        the bias circuit is supplied with a second voltage from a second power source, and
        the second power source is connected to the first power source via a diode so that idle current of the amplification transistor changes in response to a change of the voltage supplied by the first power source to the amplification transistor; and
    a temperature compensation circuit temperature compensating the bias generating circuit.

2. The integrated circuit device according to claim 1, wherein the temperature compensation circuit includes two diode-connected transistors connected in series and coupled to a third power source, the diode-connected transistors providing a temperature compensating signal to the generating bias circuit.

3. An integrated circuit device comprising:
an amplification transistor supplied with a voltage from a first power source; and
a bias circuit for applying a bias voltage to the amplification transistor, wherein the bias circuit includes an emitter-follower circuit comprising:
a first biasing transistor supplied with a second voltage from a second power source, and
a second biasing transistor connected in parallel with the first biasing transistor and having a collector coupled to the first power source so that idle current of the amplification transistor changes in response to a change of the voltage supplied by the first power source to the amplification transistor.

4. The integrated circuit device according to claim 3 including a temperature compensation circuit temperature compensating the bias circuit.

5. The integrated circuit device according to claim 4, wherein the temperature compensation circuit includes two diode-connected transistors connected in series and coupled to a third power source, the diode-connected transistors providing a temperature compensating signal to the first and second biasing transistors.

6. The integrated circuit device according to claim 4, wherein the temperature compensation circuit includes a current mirror circuit, supplied with a third voltage from a third power source and coupled to the second power source, for supplying a temperature-compensating signal to the first and second biasing transistors.

7. An integrated circuit device comprising:
an amplification transistor supplied with a voltage from a first power source; and
a bias circuit for applying a bias voltage to the amplification transistor, wherein the bias circuit comprises:
an emitter follower circuit including a biasing transistor supplied with a second voltage from a second power source through a first diode, and
a second diode connecting the first power source to the biasing transistor, the first and second diodes being connected in like polarity to the biasing transistor so that idle current of the amplification transistor changes in response to a change of the voltage supplied by the first power source to the amplification transistor.

8. The integrated circuit device according to claim 7 including a temperature compensation circuit temperature compensating of the bias circuit.

9. The integrated circuit device according to claim 8, wherein the temperature compensation circuit includes two diode-connected transistors connected in series and coupled to a third power source, the diode-connected transistors providing a temperature compensating signal to the biasing transistor.

* * * * *